US006281818B1

(12) United States Patent
Miller

(10) Patent No.: US 6,281,818 B1
(45) Date of Patent: Aug. 28, 2001

(54) AUTOMATIC AUTO-CALIBRATION SYSTEM

(75) Inventor: Jonathan D. Miller, San Mateo, CA (US)

(73) Assignee: Diamond Systems Corporation, San Mateo, CA (US)

( * ) Notice: Subject to any disclaimer, the term of this patent is extended or adjusted under 35 U.S.C. 154(b) by 0 days.

(21) Appl. No.: 09/311,892

(22) Filed: May 14, 1999

(51) Int. Cl.$^7$ .................................................. H03M 1/06
(52) U.S. Cl. ................................................ 341/120; 341/118
(58) Field of Search ................................ 341/120, 155, 341/156, 121, 161

(56) References Cited

U.S. PATENT DOCUMENTS 5,699,063 * 12/1997 Takayama ............................ 341/118

* cited by examiner

Primary Examiner—Brian Young
(74) Attorney, Agent, or Firm—Oppenheimer Wolff & Donnelly, LLP; Raymond E. Roberts

(57) ABSTRACT

An automatic calibration system (10) for use with an A/D or D/A converter circuit (12). A reference (18) provides one or more reference signals (20) such that a controller (26) can determine whether the converter circuit (12) is within calibration, and direct a calibration unit (32) to adjust calibration as needed. Sets of calibration values appropriate for differed modes, ranges, and conditions are stored in a memory unit (28), for recall and quick pseudo recalibration. A triggering unit (30), which may optionally be programmable, can then inform the controller (26) when particular events occur. True calibration may then be performed based upon a reference signal (20), or pseudo recalibration may be performed based on calibration values recalled from the memory unit (28). Optionally, the controller (26) may interface with an external system, such as a personal computer having an electronic bus (60), and thus permit external control of both the calibration system (10) and the converter circuit (12).

23 Claims, 3 Drawing Sheets

AUTOMATIC AUTO-CALIBRATION SYSTEM

TECHNICAL FIELD

The present invention relates generally to calibration of electronic components and circuits, and more particularly to calibration of analog to digital and digital to analog converters and data acquisition circuits utilizing them.

BACKGROUND ART

As our society increasingly comes to depend upon electronics technology an almost ubiquitous problem is that the transducers which we use to detect and control actions in the physical world work primarily with analog signals, yet the systems which we use to process them work with digital signals. It follows that conversion between these signal types is often required, and analog to digital (A/D) converters and digital to analog (D/A) converters have become staple components used in modem electronics design. Of primary concern herein are our ability to rely upon such converters as themselves being accurate, and our ability to effectively use them in larger systems (herein termed "external systems," since they can be spoken of as employing converters within them).

Turning first to accuracy, many factors may prompt concern in this respect. Converters must be calibrated during manufacture, and when external systems are assembled it is usually also wise to calibrate the resulting system as a whole. Further, if for nothing other than that time and events have progressed, the users of such systems often wish to recalibrate them. Aside from being a valuable form of problem diagnosis, eliminating calibration as one possible problem in a divide and conquer approach, being able to do this often significantly affects end-user's confidence in the system. Still further, converters may operate in several operating modes, being switched back and forth between modes, and possibly having several input and output channels, as well. This all compounds the problems associated with calibration and recalibration.

There are also usually very pragmatic reasons for recalibrating. Probably the most significant of these are temperature related, but many other influences and their dynamics may also exist, like pressure, mechanical stress, non-thermal radiation, etc. As for temperature, the environment in which electronic components are called upon to operate may be very dynamic and range widely in temperature. Further, electronic components by their very nature are subject to heating as they operate, commonly called "temperature drift," and A/D and D/A converters are particularly susceptible to this.

Turning to converter utility, converter calibration and recalibration (henceforth collectively just "calibration") was typically a manual operation until very recently. Technicians would make adjustments to potentiometers ("pots") mounted on circuit boards, requiring delay until they could arrive on-site and disassemble equipment or otherwise obtain access to the pots. In some cases removing covers and such might even expose the converters to different ambient environmental conditions, making calibration particularly difficult. And once on-site, and once the particular model of converter was determined, the technician might have to refer to instructions for performing calibration, since there was no set protocol across the multitude of converter manufacturers and even across the product lines of some manufacturers. This all often resulted in considerable down-time for the external system, or at least a period of reduced reliability. And, of course, the problem of manual calibration was severely exacerbated when such converters were used in truly remote locations and extreme environments, like outer space, the ocean's depths, military battle fields, etc. For these and other reasons, manual calibration is an undesirable solution.

As one solution, converters can be designed which do not require frequent calibration. They can use ultra-stable components, ones which are relatively insensitive to temperature change. But using such throughout a system is usually prohibitively expensive. Alternatively, the expected accuracy of the converter and the external system using it can be lowered, but this is merely an acknowledgement of the existence of the problem, without an attempt to solve it.

Various alternatives to manual calibration have also been attempted. Modern programmable components can be employed that allow users to calibrate the internal circuits using software commands. Recent examples in this respect even permit the use of programs having or operating under sophisticated graphical user interfaces (GUIs). However, calibration using such programs usually requires intervention in the underlying process employing the converter, which may be a serious disruption in some of the applications where converters are widely employed today. Software calibration is also increasingly portrayed as a plug and play "autocalibration" feature which is "user friendly," but such advertising puffery often fails to live up to end-user's expectations. The lack of computer user sophistication and the need to provide software programs usable across multiple operating systems and hardware platforms are often further parts of the overall problem.

Existing automatic calibration using software or hardware commands are also usually based on the drift of the system's performance over long time periods, and are not made to respond to more rapidly occurring changes, such as temperature fluctuations, for one example. Although this type of software program approach has been termed "autocalibration," that term is perhaps not strictly accurate. When a user instructs a program to perform calibration the calibration is not completely automatic, since it has not occurred autonomously. However, in recent years, there have been attempts to allow circuits to perform true auto-calibration.

U.S. Pat. No. 4,490,713 to Mrozowski discloses a microprocessor supervised A/D converter which compensates for offset drift errors due to temperature variation by using a system of recirculating remainder conversion. Generally, an initial analog input signal is converted to a digital value and stored, converted back to an analog signal which is summed with the original analog signal, and then reconverted and stored as a sixteen-bit digital word representing the analog input signal. During an initial calibration routine, full-scale positive and negative reference voltages are applied, processed, and stored as digital words. The output of a differential temperature sensor is similarly processed to produce a sixteen-bit temperature reference word and stored. During normal operation, the output of the temperature sensor is digitized and stored, and as the temperature changes a preprogrammed gain and offset storage register is searched for an appropriate compensation factor for the attendant temperature drift. The digitized word from the converted analog input is then compensated by this factor.

Although the invention in Mrozowski is an advance, there remain several disadvantages. The reliance on a preprogrammed register with pre-calculated compensation factors may produce a compensation which does not meet a present need. Because the compensation is applied digitally, there can be problems with the data range and missing codes. The process used also does not allow for a multimode circuit.

U.S. Pat. No. 5,319,370 to Signore discloses a system for calibration in an analog voltage reference used by an A/D converter. This system is termed "continuously calibrated" since it may continuously work to maintain its own compensation. This is accomplished by use of both an untrimmed analog reference voltage and a temperature measurement device. In one embodiment, the untrimmed analog reference voltage is converted to digital, compensated by applying a prestored digital trim command word, and converted to back to an analog voltage which is used to trim the analog multiplexer used by the A/D converter. An alternate embodiment uses the prestored digital trim command word to adjust the gain and offset in the digital output of the A/D converter.

This system, however, has a number of disadvantages. Neither embodiment provides an ability to the A/D converter for multiple input ranges, to recall the calibration factors in response to a change in input range, or to automatically determine when recalibration is necessary. This system also does not provide an ability to calibrate the circuit as a whole, which is particularly desirable for correcting temperature-based errors. The compensation used here is applied merely to the reference but not to other portions of the circuit.

From the preceding, it follows that there is a need for a truly automatic calibration system which responds intelligently based on key triggering stimuli, and which operates reliably across a plurality of modes, ranges, and channels.

DISCLOSURE OF INVENTION

Accordingly, it is an object of the present invention to provide a truly automatic autocalibration system.

Another object of the present invention is to provide such a system which can sense when the need exists and then initiate calibration without user intervention.

Another object of the invention is to provide such a system which can defer operation depending upon the operational status of an external system employing it.

Another object of the invention is to provide such a system which can so calibrate for all possible operating ranges and channels.

And another object of the present invention is to provide such a system which can store and recall calibration settings which are appropriate for a variety of situations.

Briefly, one preferred embodiment of the present invention is an apparatus for calibrating an analog to digital signal converter circuit. The inventive apparatus includes a triggering unit that detects when a trigger condition occurs, a memory storing calibration data associated with the various possible trigger conditions, a calibration unit that provides one or more analog calibration adjusting signals to the circuit, and a controller which monitors the triggering unit for the trigger condition, recalls prestored calibration data from the memory which is associated with an occurring trigger condition, and communicates that calibration data to the calibration unit so that it calibrates the circuit.

Briefly, an alternate preferred embodiment of the present invention is a method for calibrating an analog to digital signal converter circuit. The inventive method includes the steps of monitoring whether a trigger condition has occurred, recalling prestored calibration data associated with such a trigger condition from a memory, communicating that calibration data to a calibration unit, and adjusting the calibration of the circuit by providing at least one analog calibration signal to the circuit with the calibration unit.

An advantage of the present invention is that calibration may be fully automatic, and intelligently initiated. Using appropriate triggering stimuli, the invention may detect when calibration is desirable or needed, and also when it is not appropriate. Three particular such triggering stimuli are temperature, range or mode change, and user request. And many other triggering stimuli may be used, as desired and appropriate for particular applications.

Another advantage of the invention is that the triggering stimuli may be used to initiate either a true calibration, based on a known and reliable reference, or a pseudo calibration, based on previously stored calibration values which are appropriate for the present situation.

Another advantage of the invention is that it may be very highly programmable, even using software running under common high level operating systems having graphical user interfaces. Furthermore, the communications and control aspects of the invention may be well integrated, so that both the invention and the underlying converter are programmable and easily communicated with.

And, another advantage of the invention is that the present invention may be fully hardware based, requiring no external system intervention, which avoids the need to provide software programs for varying operating systems.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

Figure 1:
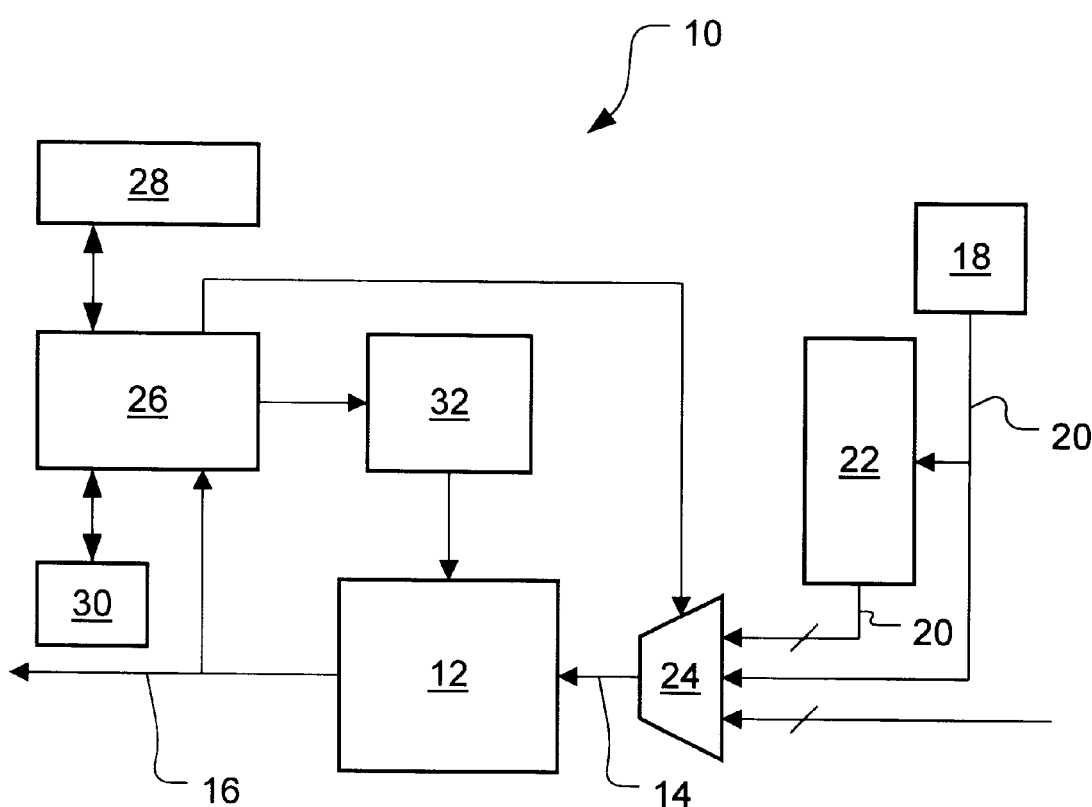
FIG. 1 is a simplified block diagram of the major elements of the calibration system and their relationships together and with the workpiece circuit.

A preferred embodiment of the present invention is a calibration system. As illustrated in the various drawings herein, and particularly in the view of FIG. 1, a preferred embodiment of the inventive device is depicted by the general reference character 10. The inventive calibration system 10 operates on a workpiece circuit depicted by the general reference character 12.

FIG. 1 is a simplified block diagram of the major elements of the calibration system 10, and of their relationships together and with the workpiece circuit 12. For present discussion, it is assumed that the workpiece circuit 12 receives only an analog input signal 14 and provides only a digital output signal 16. The calibration system 10 includes: a reference 18, which provides a first precise reference signal 20; a reference modifier 22, which provides additional precise reference signals 20; a multiplexer 24, which receives the reference signals 20 (and also external signals which the workpiece circuit 12 will ultimately be used to convert); a controller 26; a memory unit 28; a triggering unit 30; and a calibration unit 32.

The controller 26 communicates with the multiplexer 24, the memory unit 28, the triggering unit 30, and the calibration unit 32. The controller 26 also receives a sample of the digital output signal 16 from the workpiece circuit 12.

The reference 18 is used to produce the first reference signal 20 in suitable form. It is desirable that this reference signal 20 be particularly precisely known and stable, since it is the basis for all the other reference signals 20. However, within a reasonable range for the other circuitry being used, it is not actually necessary that any of the reference signals 20 have specific voltage values. Various components may be used for the reference 18. For example, a voltage source may be used directly, or a precision current source and a stable resistance may be used to create a voltage drop, or still other means may be employed. The inventor uses a precision voltage reference integrated circuit, such as Analog Devices part AD586. This electronic component provides an ultra-stable positive five volt output which has a rating of less than five parts per million for offset drift.

The reference modifier 22 is used to produce suitable additional reference signals 20. These reference signals 20 need to also be precisely known and stable, but this is fairly easily accomplished when the first reference signal 20 meets those criteria. The inventor uses a simple resistor divider network of precision low-drift resistors for the reference modifier 22.

Although it is not necessary that a plurality of reference signals 20 be generated and used, this is often desirable. The analog to digital (A/D) converter circuitry used in the workpiece circuit 12 is typically not precisely linear, so performing merely a mid-range calibration may later result in out of tolerance operation at the range extremes. To avoid this it is common practice to calibrate at the opposite ends of a range. For example, two reference signals 20 having values of 0.07 and 9.85 volts, respectively, may be used to calibrate a workpiece circuit 12 when it is in a unipolar 0–10 volt range. These two reference signals 20 will work well so long as they are precisely known and they remain stable.

The multiplexer 24 may be an entirely conventional analog switching device. Under control of the controller 26, it can switch any of the reference signals 20 into the workpiece circuit 12 for use as the analog input signal 14. If the workpiece circuit 12 is being used for multiple channels of input, the multiplexer 24 can also be used to switchably select among such input channels. As will be seen throughout the discussion herein, the inventive calibration system 10 and the workpiece circuit 12 may be substantially integrated, using some components for shared functionality.

The controller 26 may also be largely conventional. The inventor uses an application specific integrated circuit (ASIC), but this is largely a matter of design choice motivated by concerns which are peripheral to the underlying calibration system 10 invention. The controller 26 must be able to receive the digital output signal 16 from the workpiece circuit 12; it must be able to transmit instructions to the multiplexer 24 and the calibration unit 32, and it must be able to bi-directionally communicate with the memory unit 28 and the triggering unit 30. As will be discussed presently, the controller 26 can also do considerably more. For example, it may also control the workpiece circuit 12 and interface to an external system employing the workpiece circuit 12.

The memory unit 28 is treated here as conceptually separate from the controller 26 because it stores data which is ultimately received from the workpiece circuit 12 and used by the calibration unit 32. However, the memory unit 28 may actually be physically integrated into either of the controller 26 or the calibration unit 32 individually, or partially into both. This is also merely a matter of design choice.

The triggering unit 30 may be chosen from a wide range of potential devices, depending upon the variety and the nature of events which motivate calibrating the workpiece circuit 12. Without limitation, the following are a few examples. When the workpiece circuit 12 and the calibration system 10 are powered on it is desirable to either perform a true calibration of the workpiece circuit 12 or to restore it to a set of previous calibration values (unless noted otherwise, these operations are collectively termed "calibration"). It may also be desirable to calibrate after the calibration system 10 has been on for particular periods of time, or when the temperature changes by a particular amount. It will also usually be desirable to calibrate when the workpiece circuit 12 changes range or operating mode. And it is desirable to calibrate when a system using the workpiece circuit 12 requests it, say because a human user of that system wants to.

There may also be times when calibration of the workpiece circuit 12 is not desirable, say when it is heavily loaded and operating near or at its maximum capacity. The controller 26 can then intelligently ignore or delay requests from the triggering unit 30.

In the inventor's preferred embodiment, the triggering unit 30 includes a temperature sensor having programmable high and low temperature thresholds. These thresholds are provided and changed by the controller 26. For example, the low and high temperature thresholds may initially be programmed to 15 and 25 degrees centigrade, respectively. Once the triggering unit 30 triggers at the high threshold (at 25 degrees), the controller 26 can reprogram the thresholds. For instance, the new high threshold might beset to 30 degrees and the new low threshold might be 22 degrees. Some form of hysteresis control is desirable, so not using 25 immediately as the new low threshold avoids "hunting" or "trashing" if the temperature wavers back and forth around 25 degrees; alternately, a time delay before the next temperature initiated calibration operation may also suffice.

The calibration unit 32 operates by adjusting offsets and gains at various points in the workpiece circuit 12. The inventor prefers to use an octal 8-bit TrimDAC, such as Analog devices part AD8801. From the eight digital to analog (D/A) outputs which this component provides, four are used to adjust the A/D converter in the workpiece circuit 12 and the other four are used to adjust an optional D/A converter in the workpiece circuit 12. For the A/D converter in the workpiece circuit 12, coarse and fine offsets and gains are adjusted by the TrimDAC. For the D/A converter in the workpiece circuit 12 (when present), coarse and fine offsets are adjusted by two TrimDAC outputs and the other two are used for scale or range control.

Figure 2:
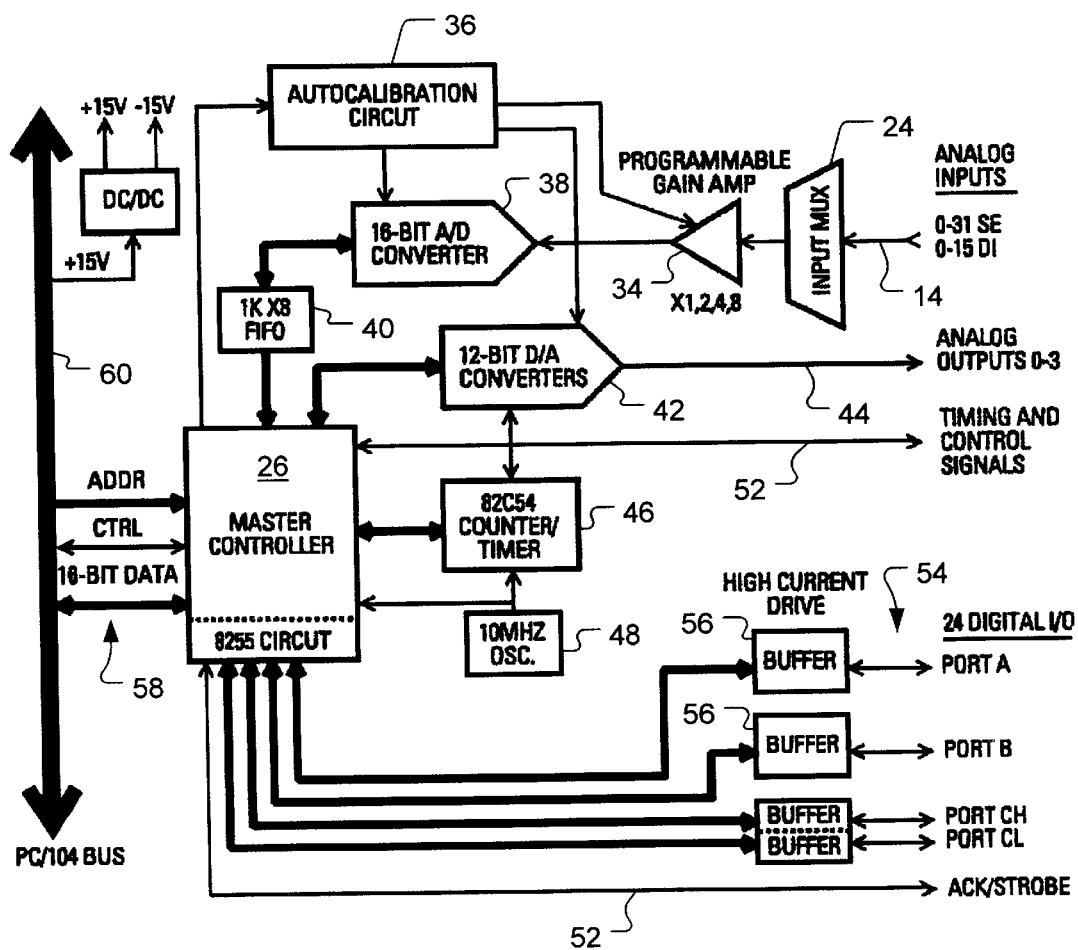
FIG. 2 is a diagram of the invention and a workpiece circuit which are highly integrated together into an embodiment which is usable by a larger system.

FIG. 2 is a diagram of the inventive calibration system 10 and a workpiece circuit 12 highly integrated together into an embodiment which is usable by a larger system, such as a personal computer system (not shown). Here the multiplexer 24 may receive a number of analog input signals 14, say 32 single ended signals or 16 differential input signals, or some mix of these (which is not commonly possible with most existing calibration systems). The output of the multiplexer 24 then goes to a programmable gain amplifier 34 (e.g., 1×, 2×, 4×, and 8× settings) which outputs into an A/D converter 38. The A/D converter 38 used by the inventor has a 16-bit (1/65,536 of full scale) resolution; bipolar ranges of ±10, ±5, ±2.5, ±1.25, and ±0.625 volts; and unipolar ranges of 0–10, 0–5, 0–2.5, and 0–1.25 volts.

As was the case for the workpiece circuit 12 in the embodiment of FIG. 1, the output of the A/D converter 38 here is also ultimately supplied to the controller 26, but it is first buffered through a first-in-first-out memory, FIFO unit 40. This memory buffer should not be confused with the memory unit 28 of FIG. 1, the equivalent of which is here integrated into the controller 26. The inventor uses a FIFO unit 40 which can hold 1024 samples, permitting interrupt initiated transfers, say of 256 or 512 samples each, to an external system employing the calibration system 10 and workpiece circuit 12. In conventional personal computers (PCs) today using operating system such as Windows 95, 98, NT etc. (TM Microsoft Corporation of Redmond, Wash.), this permits gap-free A/D sampling at rates reaching 200,000 samples per second. Of course, for lower sampling rates the FIFO unit 40 can be eliminated or disabled.

In this more sophisticated embodiment, a D/A converter 42 is provided and controlled by the controller 26. The component used by the inventor provides four 12-bit (1/4,096 of full scale) analog output signals 44 with available output ranges of ±5, ±10, 0–5, and 0–10 volts at up to ±5 milli-amps.

For general clocking needs a counter-timer 46 and an oscillator 48 are provided, and are used in generally conventional manner. For the counter-timer 46 the inventor uses a common 82C54-type component configured as a 16-bit down counter. For the oscillator 48 a 10 MHz clock oscillator is used, or an external source (not shown) may be used instead. For use as an A/D pacer clock (not shown separate from the A/D converter 38), two 82C54-type components are used configured as a 32-bit down counter.

The controller 26 has conventional digital I/O lines 52, to latch input data, synchronize data transfer, handle acknowledgements, etc. This embodiment includes three programmable direction digital I/O ports 54 (termed port A, B, and C below). These I/O ports 54 provide 24 additional inputs or outputs (8-bits each, or port A and B may be 8-bits each and a 4-bit each high and low split port C arrangement may be used). To provide high drive current capability for the I/O ports 54, I/O buffers 56 are provided to enhance the output of a 8255-type digital I/O circuit used in the ASIC design of the controller 26. To interface the controller 26 to an external system, a digital interface 58 is further provided. For example, if a PC is used as the external system, the digital interface 58 permits communications between a conventional electronic bus 60 in the PC and the calibration system 10 or the workpiece circuit 12.

The calibration circuit 36 in this embodiment is different than the calibration unit 32 of FIG. 1 in that it includes the reference 18 and reference modifier 22, and it may include the triggering unit 30 as well (it has been assigned a different number in this discussion to particularly emphasize these differences).

Figure 3:
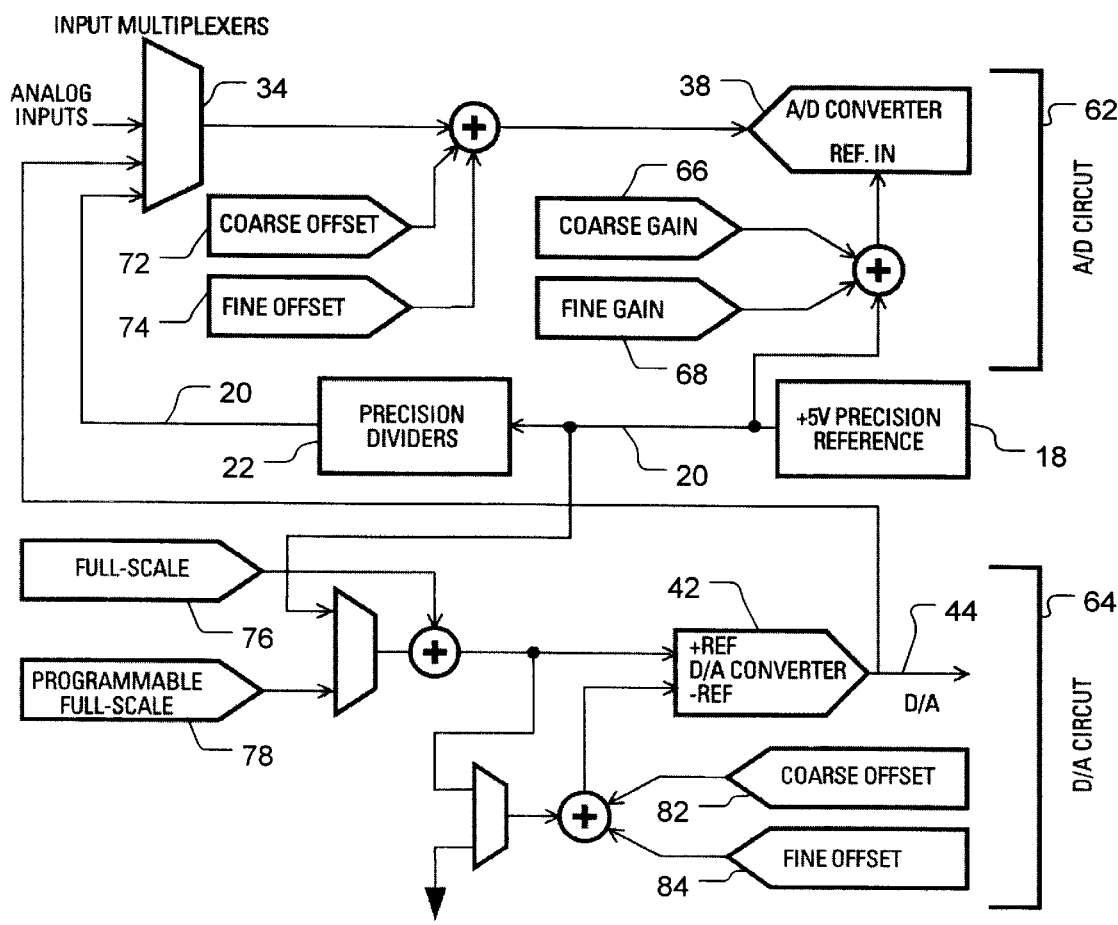
FIG. 3 is a diagram of the automatic calibration subsystem used in the integrated embodiment of FIG. 2.

FIG. 3 is a diagram of the automatic calibration capability used in the integrated embodiment of FIG. 2. Here the reference 18 and the reference modifier 22 are separately shown. An A/D circuit 62 and a D/A circuit 64 are also illustrated as physically separate portions in FIG. 3.

In the A/D circuit 62, the first reference signal 20, i.e., that directly from the reference 18, is sampled and a coarse gain adjustment 66 and a fine gain adjustment 68 may be applied to it before it is used as a reference by the A/D converter 38. A coarse offset adjustment 72 and the fine offset adjustment 74 may further be applied to the analog input signal 14 which is to be passed to the A/D converter 38.

In a calibration scenario, the secondary reference signals 20, i.e., those provided by the reference modifier 22 are received by the multiplexer 24 and one is used as the analog input signal 14. The coarse gain adjustment 66, fine gain adjustment 68, coarse offset adjustment 72, and fine offset adjustment 74 are then set to adjust out any deviation between the expected value of the reference signal 20 and actual value measured by the A/D converter 38. The values thus derived may further be stored in the memory unit 28 (FIG. 1) for later use.

In a measurement scenario, a particular previously stored set including an appropriate coarse gain adjustment 66, fine gain adjustment 68, coarse offset adjustment 72, and fine offset adjustment 74 may be recalled from the memory unit 28 and used when an analog input signal 14 is applied to the inventive calibration system 10 from the outside system.

In the D/A circuit 64, the first reference signal 20 (from the reference 18) is sampled and a full-scale adjustment 76 is applied to it to create one reference for the D/A converter 42. A programmable full-scale setting 78 may also be specified, to define a programmable output range. For use as another reference to the D/A converter 42, a coarse offset adjustment 82 and a fine offset adjustment 84 are applied.

In a calibration scenario for the D/A circuit 64, the controller 26 (FIGS. 1 and 2) directs the D/A converter 42 to provide the analog output signals 44 (recall that a four channel output is used in this embodiment, but any number is possible). The controller 26 then directs the multiplexer 24 to pass each analog output signal 44, in turn as the analog input signal 14, into the already calibrated A/D circuit 62. The controller 26 compares the presumably accurate measurements of the A/D converter 38 against what the D/A converter 42 was directed to provide, and suitable values for the full-scale adjustment 76, coarse offset adjustment 82, and fine offset adjustment 84 are derived to adjust out any deviation. These values may also further be stored in the memory unit 28 (FIG. 1) for later use. In a measurement scenario, a set of such previously derived and stored values may be applied and the resulting analog output signals 44 can be made available for use by the outside system. For a multi-channel system, as in this embodiment, the deviations between channels may also be stored in the memory unit 28 so that the best fit value can be computed and used as the target value for the calibration process.

In addition to the above mentioned examples, various other modifications and alterations of the calibration system 10 may be made without departing from the invention. Accordingly, the above disclosure is not to be considered as limiting and the appended claims are to be interpreted as encompassing the true spirit and the entire scope of the invention.

INDUSTRIAL APPLICABILITY

The present calibration system 10 is well suited for application in analog to digital conversion and digital to analog conversion, as are used widely in a variety of industries. Some present examples where there is known current need are data collection, annunciation, and security in transportation systems; in medical diagnostic and treatment equipment; and in laboratory and experimental data collection and control. The inventor's company already supplies older-generation converters for use in control functions in buses and trains, for use in radar systems, in laser hair removal and hospital operating room equipment, and in equipment for experiments performed on several space shuttle flights. These applications clearly demonstrate a present demand for converter systems which can perform rigorously in harsh environments and remote locations. By incorporating the present invention into a new generation of converters, and thereby obtaining the calibration and control capabilities which it provides, there will be clear benefit.

Implementing the calibration system 10 is also relatively easy. The inventor has already constructed a single printed circuit board embodiment having 32 analog input channels, 4 digital output channels, and a full personal computer bus interface. It follows that most existing and anticipated A/D and D/A converter applications can employ the invention.

Acceptance of the calibration system 10 should also be rapid and wide in industry. In addition to providing increased calibration and control capability and flexibility, it can often provide increased efficiency. Rather than burdening an underlying converter system, it can actually offload some existing burdens. It can simplify and speed up calibration when it is needed. It can intelligently determine when calibration is needed and reduce the occurrence of calibration to when that is the case. It can also intelligently determine when calibration should not be performed, such as when a converter system is operating near or at its capacity.

The economics of the calibration system 10 are also quite attractive. The invention costs little, and adding it during manufacture adds little to the ultimate cost of a converter. As general electronic component prices have continued to go down, it has even been the inventor's observation that converters incorporating the present invention can be introduced at essentially the same price as existing converters.

For the above, and other, reasons, it is expected that the calibration system 10 of the present invention will have widespread industrial applicability. Therefore, it is expected that the commercial utility of the present invention will be extensive and long lasting.

What is claimed is:

1. An apparatus for calibrating a circuit of the type used for converting an analog input signal to a digital output signal, the apparatus comprising:
   a calibration unit suitable for providing at least one analog calibration signal to the circuit for adjusting calibration of the circuit;
   a triggering unit suitable for detecting when at least one trigger event has occurred;
   memory unit suitable for storing calibration data associated with each said trigger event; and
   a controller suitable for:
      monitoring said triggering unit for whether a particular said trigger event has occurred;
      recalling from said memory unit prestored said calibration data which is associated with said particular said trigger event; and
      communicating said prestored said calibration data to said calibration unit to effect calibration of the circuit by said calibration unit.

2. The apparatus of claim 1, wherein said calibration unit is further suitable for providing in said calibration signals a coarse offset adjustment signal and a fine offset adjustment signal which are suitable for adjusting calibration during conversion of the analog input signal in the circuit.

3. The apparatus of claim 1, wherein said calibration unit is further suitable for providing in said calibration signals a coarse gain adjustment signal and a fine gain adjustment signal which are suitable for adjusting calibration during conversion of the analog input signal in the circuit.

4. The apparatus of claim 1, in which the circuit is further of the type used for also converting a digital input signal to an analog output signal, the apparatus furthrer comprising: a switch; and wherein
   said control unit is further suitable for operating said switch selectively to provide the analog output signal back to the circuit for use also as the analog input signal, to permit calibrating the analog output signal.

5. The apparatus of claim 4, wherein said calibration unit is further suitable for providing in said calibration signals a coarse offset adjustment signal and a fine offset adjustment signal which are suitable for adjusting calibration during conversion of the analog output signal in the circuit.

6. The apparatus of claim 4, wherein said calibration unit is further suitable for providing in said calibration signals a full-scale adjustment signal which is suitable for adjusting calibration during conversion of the analog output signal in the circuit.

7. The apparatus of claim 4, wherein said calibration unit is further suitable for providing in said calibration signals a full-scale program signal which is suitable for setting full-scale of the analog output signal in the circuit to a particular desired range.

8. The apparatus of claim 1, wherein said triggering unit detects at least one member of the set of trigger events consisting of powering on the circuit, passage of a set amount of time since the circuit was powered on, an increase of temperature by a set amount, a decrease of temperature by a set amount, and an externally originating signal requesting calibration.

9. The apparatus of claim 8, wherein said triggering unit has at least one programmable threshold for at least one of said trigger events.

10. The apparatus of claim 9, wherein:
    said triggering unit has a first said programmable threshold to detect a temperature increase past a high threshold; and
    said triggering unit has a second said programmable threshold to detect a temperature decrease past a low threshold.

11. The apparatus of claim 1 in which the circuit is further of the type having a plurality of selectable ranges for the analog input signal, wherein one said trigger event is change among the plurality of selectable ranges, for said controller to communicate instances of said calibration data to said calibration unit which are appropriate for calibration of the circuit for a particular said range.

12. The apparatus of claim 1, further comprising:
    a reference source suitable for creating a first reference signal having precise voltage; and
    a switch suitable for selectively providing said first reference signal to the circuit for use as the analog input signal; and wherein
    said memory unit contains a prestored comparison value associated with said first reference signal; and
    said controller is further suitable for:
       operating said switch to provide said first reference signal to the circuit as the analog input signal;
       receiving the digital output signal from the circuit which is created based on said first reference signal;
       retrieving said prestored comparison value from said memory unit;
       calculating particular said calibration data suitable for adjusting the circuit such that said comparison value and the digital output signal match within a desired tolerance; and
       storing said particular said calibration data in said memory unit, for later use to adjust calibration of the circuit.

13. The apparatus of claim 12, wherein said reference source includes a current source and a resistance suitable for creating a voltage drop from which said first reference signal is obtained.

14. The apparatus of claim 12, in which the circuit is further of the type having a plurality of selectable ranges for the analog input signal, the apparatus further comprising:

a reference modifier unit suitable for creating from said first reference signal at least one secondary reference signal also having precise voltage; and wherein said switch is further suitable for selectively providing one of said reference signals to the circuit for use as the analog input signal;

said memory unit contains a plurality of said prestored comparison values, one respectively associated with each of said reference signals;

said triggering unit is further suitable for detecting said trigger events which include changes among the plurality of selectable ranges; and said controller is further suitable for:

detecting which of the plurality of selectable ranges is a current range; and storing said particular said calibration data in said memory unit in a manner associated with said current range, for later use to adjust calibration of the circuit when it is returned to said current range.

15. The apparatus of claim 12, wherein said controller is further suitable for receiving externally originating commands, for interactively controlling the processes of obtaining said calibration data and calibrating the circuit.

16. The apparatus of claim 12, in which the circuit is further of the type used for also converting a digital input signal to an analog output signal, such that the circuit has output modes which are both analog and digital, wherein:

said switch is further suitable for selectively providing the analog output signal back to the circuit for use also as the analog input signal; and said controller is further suitable for:

detecting which of the modes of the circuit is a current mode; and storing said particular said calibration data in said memory unit in a manner associated with said current mode, for later use to adjust calibration of the circuit when it is returned to said current mode.

17. The apparatus of claim 16, wherein said calibration unit is further suitable for providing in said calibration signals a coarse offset adjustment signal and a fine offset adjustment signal which are suitable for adjusting calibration during conversion of the analog output signal in the circuit.

18. A method for calibrating a circuit of the type used for converting an analog input signal to a digital output signal, the method comprising the steps of:

monitoring whether a trigger event has occurred;

recalling prestored calibration data associated with said particular trigger event from a memory;

communicating said prestored calibration data to a calibration unit; and adjusting calibration of the circuit by providing at least one analog calibration signal to the circuit with said calibration unit.

19. The method of claim 18, wherein said trigger event is a member of the set consisting of powering on the circuit, passage of a set amount of time since the circuit was powered on, an increase of temperature by a set amount, a decrease of temperature by a set amount, crossing a preprogrammed temperature threshold, and request by an external system.

20. The method of claim 18, wherein said prestored calibration data is for directing said calibration unit to provide said at least one analog calibration signal including at least one member of the set consisting of a coarse offset adjustment signal, a fine offset adjustment signal, a coarse gain adjustment signal, and a fine gain adjustment signal which are suitable for adjusting calibration during conversion of the analog input signal in the circuit.

21. The method of claim 18, wherein the circuit is further of the type used for also converting a digital input signal to an analog output signal, and the method further comprising:

switching the analog output signal back into the circuit; and calibrating the analog output signal.

22. The method of claim 21, wherein said prestored calibration data is for directing said calibration unit to provide said at least one analog calibration signal including at least one member of the set consisting of a coarse analog input signal offset adjustment signal, a fine analog input signal offset adjustment signal, a coarse analog input signal gain adjustment signal, a fine analog input signal gain adjustment signal, a coarse analog output signal offset adjustment signal, a fine output input signal offset adjustment signal, a full-scale analog output adjustment signal, and a full-scale program signal which is suitable for setting full-scale of the analog output signal in the circuit to a particular desired range.

23. A method for calibrating a circuit of the type used for converting an analog input signal to a digital output signal, the method comprising the steps of:

switching a reference signal having a precise voltage into the circuit as the analog input signal;

converting said reference signal into the digital output signal using the circuit;

comparing the digital output signal to a prestored comparison value associated with said precise voltage of said reference signal calculating calibration data suitable for adjusting calibration of the circuit;

storing said calibration data for later use to adjust calibration of the circuit.

* * * * *